United States Patent [19]
Kosak et al.

[11] Patent Number: 6,067,035
[45] Date of Patent: *May 23, 2000

[54] METHOD FOR MONITORING THE OPERABILITY OF AN ANALOG TO DIGITAL CONVERTER CONFIGURED FOR DIGITIZING ANALOG SIGNALS

[75] Inventors: Wolfgang Kosak, Moeglingen; Guenter Braun, Bietigheim; Margit Mueller, Asperg; Dietmar Blessing, Holzgerlingen, all of Germany

[73] Assignee: Robert Bosch GmbH, Stuttgart, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/905,263

[22] Filed: Aug. 1, 1997

[30] Foreign Application Priority Data

Aug. 8, 1996 [DE] Germany ............ 196 31 972

[51] Int. Cl.$^7$ ............................... H03M 1/10
[52] U.S. Cl. ................................. 341/120
[58] Field of Search ................ 341/120, 155, 341/157

[56] References Cited

U.S. PATENT DOCUMENTS 4,894,656  1/1990  Hwang et al. ............... 341/120
5,063,383  11/1991 Bobba ........................ 341/120
5,107,427  4/1992  Peter et al. .............. 364/424.03

FOREIGN PATENT DOCUMENTS 0 579 235   1/1994  European Pat. Off. .
36 21 937   1/1988  Germany .
2234124     1/1991  United Kingdom .

OTHER PUBLICATIONS

Analog Devices' Mixed Signal Design Seminar Handbook ©1991 pp. VI–4 to VI–5.

*Primary Examiner*—Howard L. Williams
*Attorney, Agent, or Firm*—Kenyon & Kenyon

[57] ABSTRACT

A method is distinguished in that outside of the analog/digital converter, on the basis of an analog signal (UA) to be digitized by the analog/digital converter, a sequence of digital pulses (P2) is generated, of which at least the width or the repetition frequency is analog signal-dependent, and that a digital result determined based on the pulse sequence and the digital value generated on the basis of the same analog signal by the analog to digital converter are checked for conformance with one another. As such, in a simple manner, a continuous monitoring of the A/D converter to be monitored is rendered possible during its "normal" operation.

12 Claims, 5 Drawing Sheets

METHOD FOR MONITORING THE OPERABILITY OF AN ANALOG TO DIGITAL CONVERTER CONFIGURED FOR DIGITIZING ANALOG SIGNALS

FIELD OF THE INVENTION

The present invention relates to a method for monitoring the operability of an analog to digital converter configured for digitizing analog signals.

BACKGROUND INFORMATION

Monitoring methods are described, for example, in German Patent Application No. 36 21 937, A1, U.S. Pat. No. 5,063,383, and European Patent Application No. 0 579 235 A2. The methods described in these publications have in common that known analog test signals are applied in special test phases to the analog to digital converter (A/D converter) to be monitored, and that the digital values generated from these test signals by the A/D converter to be monitored are checked for correctness by comparing them to known nominal values.

During such check tests (test phases) of A/D converters, these cannot be used or, at most, only have a restricted use for "normal" A/D conversions. For this reason, in particular, the check test cannot take place continuously, but rather only in relatively large time intervals.

One way to rectify this problem would be to provide a more or less identical second A/D converter in parallel to the A/D converter to be monitored, and to check the digital values generated by the A/D converters for consistency. However, the practical realization of a monitoring method of this kind, especially because of the provision of a second A/D converter, requires considerable engineering outlay and is, therefore, expensive.

SUMMARY OF THE INVENTION

The method according to present invention enables the A/D converter to be continuously monitored in a simple manner during its "normal" operation.

A sequence of digital pulses are generated outside of the analog to digital converter on the basis of an analog signal to be digitized by the analog to digital converter. At least the width or the repetition frequency of the digital pulse sequence is analog signal-dependent. This pulse sequence and the digital value generated on the basis of the same analog signal by the analog to digital converter are checked for conformance with one another.

Thus, an analog signal to be digitized is, on the one hand, digitized by the A/D converter to be monitored and, on the other hand, subjected to a signal processing with an analog signal-dependent result. This signal processing takes place in a separate signal processing circuit which is independent of the A/D converter to be monitored and which—compared to an A/D converter—can be recognizably simple in design.

From the selected analog signal, two digital signals are generated representing, independently of one another and in different ways, the analog signal. Given a properly functioning A/D converter, the two digital signals correspond to one another and to the signal-processing circuit in so far as they are attributable to identical analog signals.

The fact that the operability of the A/D converter is monitored in the final analysis by contrasting two signals that are actively generated independently of one another means that there is no need to feed in predefined test signals; rather, the selected analog signal can by any desired one of the analog signals to be converted in the "normal" operation of the A/D converter.

As a result, the A/D converter can be monitored for operability continuously and entirely without making any kind of intervention in the "normal" conversion process.

Therefore, a method has been found which enables the A/D converter to be continuously monitored in the simplest possible manner during its "normal" operation.

Furthermore, the monitoring method according to the present invention is also distinguished by a possibility for error detection that is unique as compared to known methods. The fact that two digital signals are generated from the selected analog signal and represent, independently of one another and in different ways, the analog signal, makes it possible, namely, in addition to detecting faults in the A/D converter, also for errors to be determined in the A/D converter design.

DETAILED DESCRIPTION

In the exemplary embodiments described in the following, the A/D converters to be monitored are integrated in each case in a central processing unit (microprocessor, micro controller, signal processor, etc.), which may constitute the main computer of a motor vehicle control unit, for example.

The central processing units each have a plurality of analog signal connections ADx (only partially shown in the Figures), which can be fed a plurality of analog signals to be digitized by the A/D converter.

The analog signals to be digitized may be output signals from sensors, e.g., the output signals from the set-point potentiometer of a pedal-value indicator (valuator device) in a motor vehicle.

It is certainly not limited to this, however. It is neither necessary that the A/D converter to be monitored be integrated in a central processing unit, nor is it necessary that the central processing unit containing the A/D converter to be monitored contain a plurality of analog-signal connections. It is also not necessary for the A/D converter to be used for motor vehicle control. Accordingly, the analog signals to be digitized can be any analog signals of any origin.

Figure 1:
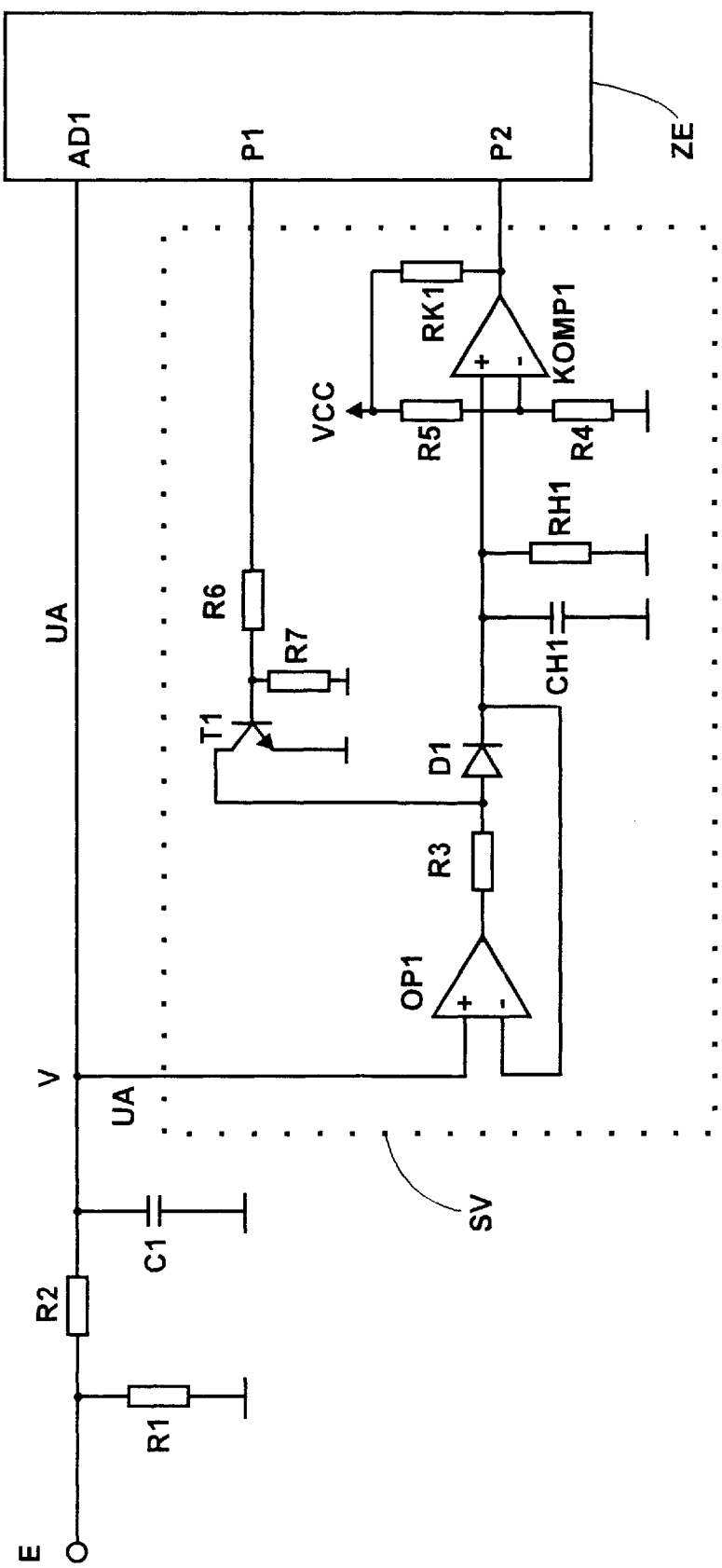
FIG. 1 schematically shows a first exemplary embodiment of a circuit arrangement suited for implementing the method of the present invention.

The central processing unit containing the A/D converter to be monitored is designated by reference symbol ZE in FIG. 1. The analog signal to be digitized by the A/D converter, itself not shown, is input into the central processing unit via an analog-signal connection A/D of the central processing unit.

The analog signal to be digitized is supplied via an input terminal E to the circuit arrangement shown in FIG. 1. It first propagates through an input network comprised of resistors R1 and R2, as well as of a capacitor Cl, and then arrives at a node V. From this node V, the analog signal designated in the following as UA arrives, on the one hand, at the already mentioned analog signal connection A/D of central processing unit ZE and, on the other hand, in a signal processing circuit SV drawn in as a dotted-line frame.

The analog signal UA arriving at the analog-signal input A/D1 of the central processing unit ZE is digitized by the A/D converter (not shown in the Figure) that is integrated in the central processing unit.

At the same time, as described in detail in the following, the analog signal UA is processed in signal-processing circuit SV provided separately from the A/D converter into an analog signal-dependent digital pulse sequence, which is fed into an input connection (port) P2 of central processing unit ZE, said input connection (port) P2 being configured for inputting digital signals.

The digital pulse sequence is so constituted that it clearly represents analog signal UA, on whose basis it had been generated, and is, therefore, suited to be contrasted for comparison purposes with the digital value generated by the A/D converter. It is checked in this comparison (within central processing unit ZE) whether the signals that are being compared to one another and that represent the analog signal in different ways (digital value or pulse sequence) correspond to one another, i.e., originate from the same analog signal.

If it is ascertained during the comparison that the signals being compared conform with one another, then the assumption can be made that both the A/D converter and the signal-processing circuit work in an error-free manner.

On the other hand, if the comparison reveals that the signals do not conform with one another, then there is an error in the A/D converter and/or in the signal-processing circuit SV, to which an appropriate response must be given (e.g., by turning off the unit or by carrying out a malfunction control specially provided for such cases).

The functioning of the signal-processing circuit SV and the pulse sequence generated by it will now be described.

Analog signal UA, fed into signal-processing circuit SV, is transmitted—if and for as long as a diode D1 is not blocking—via an operational amplifier OP1 being used as a voltage follower, via a resistor R3 and diode D1 to a capacitor CH1 which carries out a holding (keep-alive) function and, as a result, is charged to a voltage UCH corresponding to the analog voltage.

If diode D1 is shifted into the blocking state in a manner that will still be described in greater detail, then capacitor CH1 is uncoupled from the analog voltage source and discharges itself more or less rapidly via a resistor RH1 connected in parallel thereto. As a result, the voltage being applied to capacitor CH1 begins to fall.

Capacitor CH1 is connected to a first input connection of a comparator KOMP1. The second input connection of comparator KOMP1 receives a threshold voltage UT, which is tapped off from a voltage divider comprised of resistors R4 and R5.

Comparator KOMP1 compares the voltages being applied to it, i.e., (variable) capacitor voltage UCH and (constant over time) threshold voltage UT.

The output signal from comparator KOMP1, which at the same time is the output signal from signal-processing circuit SV, has a high level, if and for as long as capacitor voltage UCH is greater than threshold voltage UT; this is assured by a comparator resistor RK1 connected between the output of comparator KOMP1 and a supply voltage VCC. If capacitor voltage UCH falls below threshold voltage UT—for example due to the discharging of capacitor CH1 that begins after the blocking of diode D1 by way of resistor RH1—, then the comparator switches over, and its output signal changes from high level to low level.

The higher the voltage UCH at capacitor CH1 was at the instant of blocking of diode D1, the longer it takes until said voltage drops, as a result of the discharging, to a value that is less than threshold voltage UT. This effect, which is also reflected in the output signal of the signal-processing circuit, makes it possible for the output signal of the signal-processing circuit SV to be used for monitoring the A/D converter, as will be described in greater detail below.

The switching over of diode D1 from the conducting state into the blocking state and vice versa is induced by a control signal that is output via an output signal connection Pi of central processing unit ZE.

This control signal is applied to the base of a transistor T1 that is connected to resistors R6 and R7 and whose emitter is connected to ground and whose collector is connected to the connection between resistor R3 and diode D1. For as long as the control signal is at a low level, transistor T1 is blocking, and diode D1 is and remains in the conducting state. If the control signal changes to the high level, then transistor T1 connects through and pulls the connection between resistor R3 and diode D1 to ground potential, which, in turn, results in diode D1 being switched over into the blocking state.

What is noteworthy here is that the blocking of diode D1, thus the isolation of capacitor CH1 from the analog voltage is carried out so as to leave analog voltage UA that is input for A/D conversion via analog-signal connection AD1 into central processing unit ZE completely unaffected and, therefore, does not influence or disturb the digitization of this signal by the A/D converter to the slightest degree.

Along with the switching of diode D1 over to the blocking state begins the discharging of capacitor CH1, which leads finally, as already elucidated above, to a switching over of the output signal of the comparator from a high level to a low level.

The time that elapses from the switching over of diode D1 into the blocking state until the switching over of the output signal of the comparator from high level to low level is recognizably a measure for the initial difference between the analog voltage and the threshold voltage; ideally, there is even a direct proportionality between said time and said voltage difference. When the time and the magnitude of the threshold voltage are known, the magnitude of the underlying analog voltage can be determined. This makes it possible, in turn, to check the correctness (conformance) of the digital value, which is generated by the A/D converter to be monitored, on the basis of the same analog signal.

The specified time is able to be easily determined in central processing unit ZE when the instant is known when diode D1 switches over into the blocking state and when the instant is known when the output signal of the comparator switches over from high level to low level. The instant when diode D1 switches over into the blocking state is known to the central processing unit ZE, since said central processing unit ZE itself outputs the control signal via port P1 that induces the switch-over. The instant that the output signal of the comparator switches over from high level to low level can be determined by the central processing unit by monitoring the level of this signal (fed into port PT of central processing unit ZE).

Threshold voltage UT is definitively set by the voltage divider comprised of resistors R4 and R5 and may well be known to the central processing unit.

Because of the data known to central processing unit ZE and through the evaluation of the analog signal-dependent output signal transmitted to the central processing unit ZE by the signal-processing circuit, the central processing unit ZE is able to monitor the integrated A/D converter during its "normal" operation quasi in real time with respect to its operability.

To elucidate further details, the exact chronological sequence of the processes taking place in signal-processing circuit SV are described in detail in the following with reference to FIG. 2.

Considered initially are only the control signal, likewise denoted here by P1 and output from port P1 of the central processing unit ZE, capacitor voltage UCH being applied by way of capacitor CH1, and output voltage UK, likewise denoted here by P2, of comparator KOMP1 input into port P2 of central processing unit ZE. The signal pattern denoted by P2' concerns a modification in signal-processing circuit SV shown in FIG. 1, and will be described below.

Figure 2:
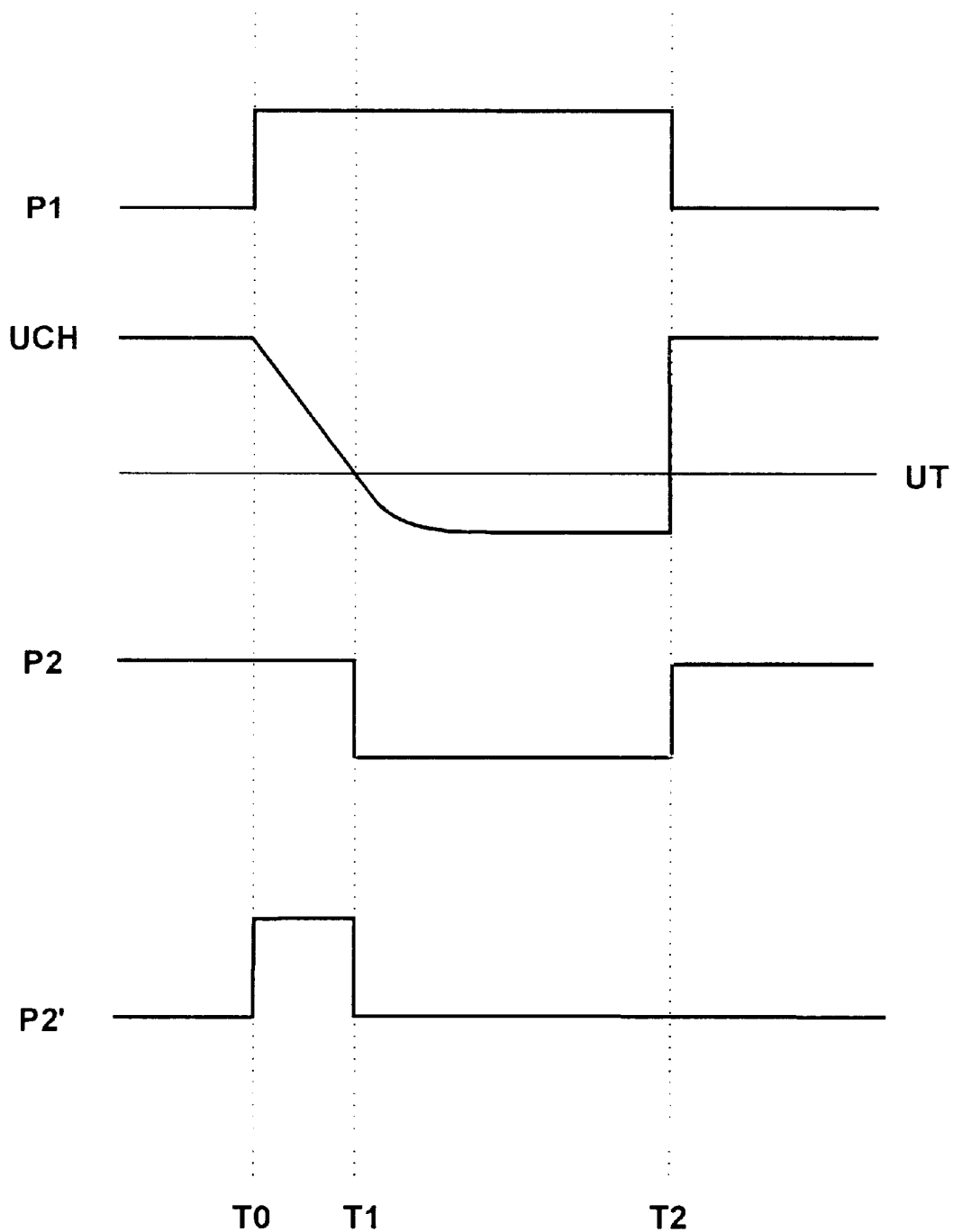
FIG. 2 shows signal patterns over time for illustrating the functioning of the circuit arrangement shown in FIG. 1.

Prior to an instant denoted by T0 in FIG. 2, the control signal (signal P1) output via port P1 of central processing unit ZE is at a low level. Therefore, diode D1 is in the conducting state, and capacitor voltage UCH being applied to capacitor CH1 follows and essentially corresponds to analog voltage UA that is fed into signal-processing circuit SV and that may well be constant and relatively high during the time period shown in the Figure. Output voltage UK (signal P2) of comparator KOMP1 is at a high level, since capacitor voltage UCH is greater than threshold voltage UT.

At instant T0, the control signal (signal P1) output via port P1 of central processing unit ZE changes from low level to high level. As a result, diode D1 is switched from the conducting state into the blocking state, which, in turn, isolates capacitor CH1, which is essentially charged to analog voltage, from the analog voltage.

Therefore, capacitor CH1 begins to discharge by way of resistor RH1, which results in a drop in capacitor voltage UCH also being applied in comparator KOMP1. For as long as capacitor voltage UCH is still greater than threshold voltage UT, output voltage UK (signal P2) of comparator KOMP1 fed into port P2 of central processing unit ZE remains at a high level.

At instant T1, capacitor voltage UCH falls below threshold voltage UT. As a result, output signal UK (signal P2) of comparator KOMP1 changes from high level to low level.

At instant T2, control signal (signal P1) output via port P1 of central processing unit ZE drops back again to the low level. As a result, diode D1 is switched from the blocking state into the conducting state, through which means the analog voltage is again switched through to capacitor CH1 and comparator KOMP1. This, in turn, causes output voltage UK (signal P2) of comparator KOMP1 to rise from the low to the high level, and capacitor CH1 is charged to a voltage corresponding to the analog voltage.

Thus, the state prevailing prior to instant T0 is again reached, and the next comparison cycle can be started (as the result of the control signal output from port P1 of central processing unit ZE changing once more to the high level). When such comparison cycles are repeatedly carried out, the signal-processing circuit generates a sequence of pulses, whose width is analog signal-dependent, the pulses making it possible to continuously monitor the operability of the A/D converter, without having to interrupt its "normal" operation by feeding in discrete test signals or the like.

Signal-processing circuit SV shown in FIG. 1 can be so modified that the comparator resistor RK1 does not receive supply voltage VCC, as shown in FIG. 1, but rather is linked to port P1 of central-processing unit ZE.

This has as a result that during the time periods when capacitor voltage UCH is greater than threshold voltage UT, output signal UK from comparator KOMP1 assumes the prevailing level of the control signal output from port P1 of central-processing unit ZE. A voltage curve as shown in FIG. 2 at P2' is then obtained at port P2 of central-processing unit ZE.

Thus, in contrast to the variant of the signal-processing circuit shown in FIG. 1, a voltage curve is obtained at port P2, which permits the time needed to reconstruct the analog signal (time between T0 and T1) to be determined solely under consideration of this signal, i.e., without additionally considering the time characteristic of the control signal output from port P1; the time sought corresponds in this case namely exactly to the duration of the high-level phase of the signal input into port P2.

A thus modified variant of the signal-processing circuit is especially advantageous when central-processing unit ZE, such as 80C166/167, is provided with a "gated timer mode."

Provision can be made for a second modification of signal-processing circuit SV shown in FIG. 1 that is independent of the just described first modification of the same in that resistor RH1, via which capacitor CH1 discharges, is replaced by a constant current source.

Figure 3:
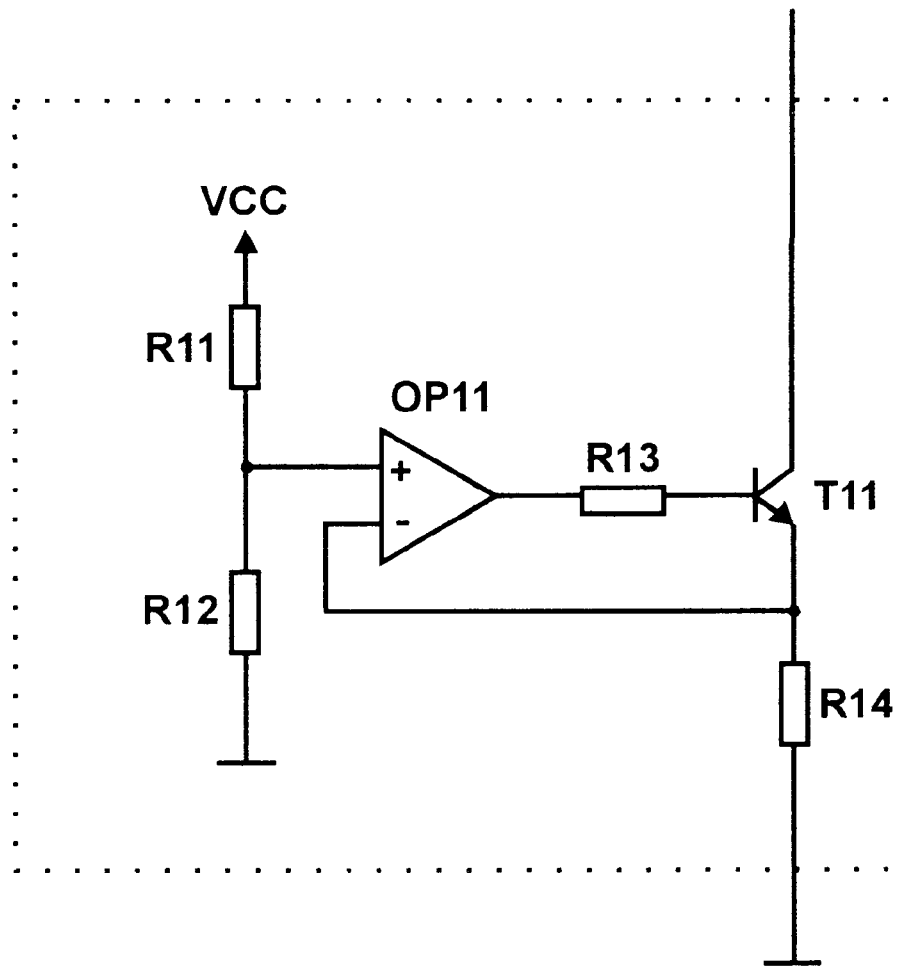
FIG. 3 schematically shows a constant current source for discharging a capacitor constantly over time.

One possible specific embodiment of a suitable constant current source is shown in FIG. 3.

The constant current source shown in FIG. 3 is comprised of resistors R11, R12, R13 and R14 (e.g., with values of 26.1 kΩ, 1 kΩ, 1 kΩ and 1 kΩ, respectively), an operational amplifier—OP11 (e.g., LM2904) and a transistor T11 (e.g., BCW60), which are interconnected as shown in FIG. 3.

This constant current source, is able to discharge capacitor CH1 with a constant current. The characteristic curve of capacitor voltage UCH shown in FIG. 2 during discharging of capacitor CH1 can, in this manner, be linearized, as needed, i.e., made to approach a straight line. This, in turn, has the positive effect of establishing a linear correlation between the analog voltage—threshold voltage difference and the time span between T0 and T1.

Figure 4:
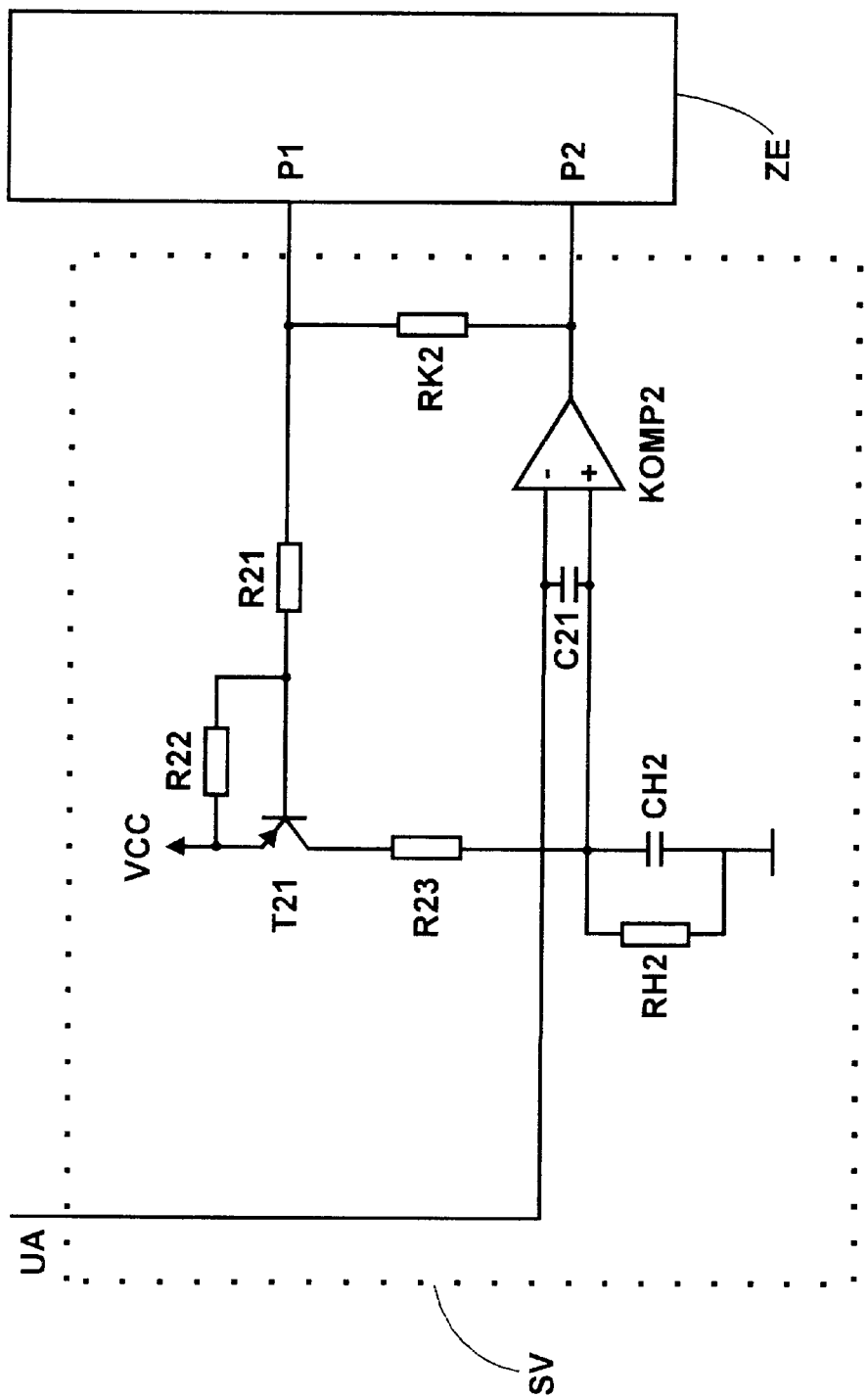
FIG. 4 schematically shows a second exemplary embodiment of a circuit arrangement suited for implementing the method of the present invention.

FIG. 4 illustrates a second exemplary embodiment of a circuit arrangement that is suited for implementing the method of the present invention.

In contrast to the representation in FIG. 1, the representation in FIG. 4 is essentially limited to signal-processing circuit SV. Even though not shown in FIG. 4, here as well, analog signal UA to be digitized is input, on the one hand, directly into central-processing unit ZE or into the A/D converter integrated therein and, on the other hand, into signal-processing circuit SV.

In the circuit arrangement shown in FIG. 4, the analog voltage UA input into the signal-processing circuit is input directly into a comparator KOMP2. A threshold voltage is input into the other input connection of the comparator. In contrast to the first exemplary embodiment and as will be described later on in greater detail, this threshold voltage varies as a function of time.

The output voltage from comparator KOMP2 is input, as in the first exemplary embodiment, as an input signal into a port P2 of central-processing unit ZE. A comparator resistor RK2 is provided (as in the case of the first modification to the first exemplary embodiment) between port P1 and port P2 of the central-processing unit and, thus, during those times when the variable threshold voltage is greater than the analog voltage, assures that the output signal from comparator KOMP2 assumes the level of the control signal output from port P1 of the central-processing unit. Instead, comparator resistor RK2 could also be linked to supply voltage VCC, in the same way as comparator resistor RK1 in FIG. 1.

In the present exemplary embodiment, it is determined by means of the control signal output from port P1 whether capacitor CH2 is linked to supply voltage VCC or is isolated therefrom.

When and for as long as the control signal output from port P1 has a low level, capacitor CH2 is linked by the then conductive transistor T21, which, as shown, is wired to resistors R21 and R22, and is discharged via a resistor R23 to a voltage corresponding to supply voltage VCC. In this context, the supply voltage is at least as great as, preferably however, greater than the maximally occurring analog voltage.

The comparison cycle begins, as it does already in the case of the first exemplary embodiment, with the change in the control signal output from port P1 from low level to high level. This effects a blocking of transistor T21 and, thus, an isolation of capacitor CH2 from supply voltage VCC. At the same time, the capacitor begins to discharge via resistor RH2 provided parallel thereto.

As is apparent from FIG. 4, the capacitor voltage is, at the same time, the threshold voltage input into comparator KOMP2.

For as long as in this phase, i.e., during the high-level phase of the control signal output from port P1 of central-processing unit ZE, the threshold voltage is greater than the analog voltage, the output signal from the comparator is at a high level (the level of the control signal, to which it is linked via resistor RK2). If, as a result of the progressive discharging of capacitor CH2, the threshold voltage falls below the analog voltage, the output signal from the comparator drops to the low level.

For a predefined time after the control signal output from port P1 of central-processing unit ZE rises to the high level, it drops back again to the low level, through which means capacitor CH2 is again charged to supply voltage VCC. The comparison cycle under consideration is, thus, ended.

The higher the analog voltage is, the shorter is the time that elapses until the threshold voltage that is dropping in response to the discharging of capacitor CH2 falls below this analog voltage.

The result is that a voltage profile is obtained at port P2 of central processing unit ZE, as shown at P2' in FIG. 2. The high-level phase of this signal corresponds in the present exemplary embodiment, however, to the time during which the gradually falling threshold voltage is greater than the analog voltage.

As in the first exemplary embodiment, the specified time is a measure for the initial difference between the analog voltage and the threshold voltage. Accordingly, here as well, when the specified time and the (initial) magnitude of the threshold voltage are known, thus the magnitude of the supply voltage VCC, the magnitude of the underlying analog voltage can be determined. This, in turn, makes it possible to check the correctness (conformance) of the digital value generated on the basis of the same analog signal by the A/D converter to be monitored. For further details, the relevant explanations pertaining to the previously described first exemplary embodiment apply here.

It likewise applies in the second exemplary embodiment as in the first exemplary embodiment that when the described comparison cycles are repeatedly carried out, the signal-processing circuit generates a sequence of pulses whose width is analog signal-dependent, said pulses making it possible to continuously monitor the operability of the A/D converter, without having to interrupt its "normal" operation by feeding in discrete test signals or the like.

To improve the linearity between the initial analog voltage—threshold voltage difference and the duration of the high-level phase of the voltage profile input into port P2, one can consider here as well, as in the first exemplary embodiment, replacing resistor RH2, by way of which capacitor CH2 discharges, with a constant current source, which keeps the current flow constant during discharging of the capacitor and, consequently, assures a uniformly fast discharging of the capacitor. For this, the constant current source shown in FIG. 3 and already described above can be considered, for example.

In comparison with the first exemplary embodiment, the second exemplary embodiment described with reference to FIG. 4 has, in particular, the advantages that 1) the analog voltages to be drawn upon for monitoring the operability of the A/D converter are not subjected to any limitations with respect to their magnitude; and
2) the required expenditure for components is reduced to a minimum.

A third exemplary embodiment of a circuit arrangement suited for implementing the method of the present invention will now be described with reference to FIG. 5.

Figure 5:
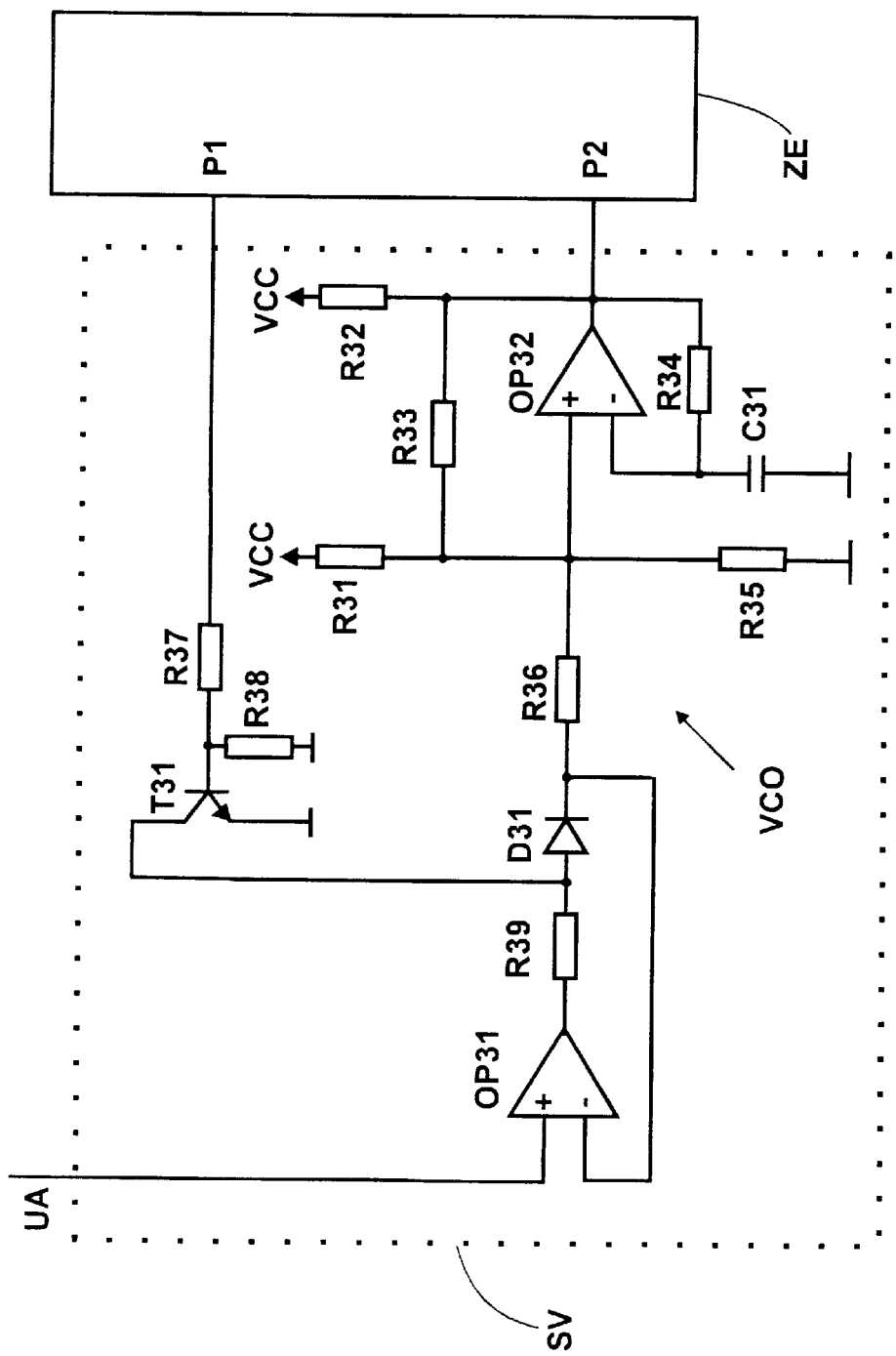
FIG. 5 schematically shows a third exemplary embodiment of a circuit arrangement suited for implementing the method of the present invention.

As in the representation in FIG. 4, the representation in FIG. 5 is essentially limited to the signal-processing circuit SV. Although this is not shown in FIG. 5, here as well, the analog signal UA to be digitized is directly input, on the one hand, into central-processing unit ZE or into the A/D converter integrated therein and, on the other hand, into signal-processing circuit SV.

In signal-processing circuit SV, the analog signal fed into the circuit arrives via a voltage follower, constituted by a suitably wired operational amplifier OP31, at a voltage-controlled frequency oscillator VCO. The frequency oscillator generates a pulse sequence that is fed as an input signal into port P2 of the central-processing unit and whose frequency is a function of the magnitude of the voltage applied thereto, i.e., of the analog voltage.

In the present exemplary embodiment, frequency oscillator VCO is comprised of resistors R31 through R36, of a capacitor C31 and of an operational amplifier OP32, which is wired as shown in FIG. 5.

A benefit of signal-processing circuit SV shown in FIG. 5 is that only one port, i.e., in this case port P2 of central-processing processing unit ZE is required. Port P1 and its wiring configuration shown in FIG. 5 (resistors R37 through R39, transistor T31 and diode D31) are not necessarily needed or can be omitted.

Port P1 and its wiring configuration are provided in accordance with the representation in FIG. 5 as an advantageous further refinement and is not a prerequisite for the proper functioning of the depicted circuit arrangement. It is possible, namely, to effect a scaling of oscillator VCO in the disclosed manner, or more precisely stated, to eliminate the tolerance of capacitor C31.

If a signal having a high level is output via port P1, connects through transistor T31, and diode D31 is shifted, into the blocking state. If, in this stage, in which oscillator VCO is driven because of blocking diode D31 by a voltage of approximately 0V, one determines the frequency generated and output by the oscillator and, on this basis, scales the frequency—analog voltage correspondence that ensues in central-processing unit ZE, then this makes it possible to eliminate any existing component tolerances and, in fact, not only tolerances that are conditional upon manufacturing, but also those caused by ageing and environmental influences.

The analysis of the voltage profile input into port P2 can either be accompanied by a determination of the frequency or when the pulse duty factor is constant—as in the first and second exemplary embodiment, accompanied by an evaluation of the duration of the prevailing high-level and/or low-level phases.

Independently of this, from the analog signal-dependent pulse sequence generated by the signal-processing circuit, the underlying analog signal is able to be reconstructed, so that this signal, as well, is suited for continuously monitoring the operability of the A/D converter during its "normal" operation.

What is claimed is:

1. A method for monitoring an operability of an analog to digital (A/D) converter during a normal operation of the analog to digital converter, the A/D converter being configured for digitizing analog signals, comprising the steps of:
generating a sequence of rectangular pulses outside of the A/D converter as a function of an analog signal to be digitized by the A/D converter, at least one of a width and a repetition frequency of the rectangular pulses being analog signal-dependent, the rectangular pulses being generated using a signal processor circuit outside of a central processing unit;
inputting the rectangular pulses from the signal processing circuit into the central processing unit for conversion to a digital result;
generating by the A/D converter a digital value as a function of the analog signal; and
checking the digital result and the digital value for conformance with one another.

2. The method according to claim 1, further comprising the steps of:
integrating the A/D converter to be monitored into a central processing unit having a plurality of analog signal connections for receiving analog signals to be digitized by the A/D converter.

3. The method according to claim 2, further comprising the step of using the signal-processing circuit to carry out repeated comparison cycles, a beginning and an end of each of the comparison cycles being determined by a control signal output by the central processing unit to the signal-processing circuit.

4. The method according to claim 3, further comprising the step of determining in each of the comparison cycles when a signal-processing circuit capacitor, which is charged to an analog voltage and is isolated from the analog voltage when the comparison cycle begins, is discharged to below a constant threshold voltage.

5. The method according to claim 4, further comprising the step of isolating the capacitor from the analog voltage such that the analog signal input into the central processing unit for digitization is prevented from being influenced.

6. The method according to claim 1, further comprising the step of using an analog voltage as a control voltage for a voltage-controlled frequency oscillator.

7. The method according to claim 1, wherein the sequence of rectangular pulses is a signal having only two discrete levels.

8. The method according to claim 7, wherein the two levels include a high level and a low level.

9. A method for monitoring an operability of an analog to digital (A/D) converter configured for digitizing analog signals, comprising the steps of:
generating a sequence of rectangular pulses outside of the A/D converter as a function of an analog signal to be digitized by the A/D converter, at least one of a width and a repetition frequency of the rectangular pulses being analog signal-dependent;
generating an analog signal-dependent result as a function of the digital pulses, the digital value representing the analog signal in a way that is different than a way in which the digital pulses represent the analog signal;
checking the analog signal-dependent result and a digital value generated by the A/D converter as a function of the analog signal for conformance with one another;
charging a signal-processing circuit capacitor to a supply voltage which is greater than a maximum analog voltage;
isolating the capacitor from an analog voltage before a comparison cycle begins; and
determining in the comparison cycle when the capacitor is discharged to below the analog voltage.

10. The method according to claim 9, further comprising the step of discharging the capacitor with a constant current.

11. A method for monitoring an operability of an analog to digital (A/D) converter configured for digitizing analog signals, comprising the steps of:
generating a sequence of digital pulses outside of the A/D converter as a function of an analog signal to be digitized by the A/D converter, at least one of a width and a repetition frequency of the digital pulses being analog signal-dependent;
generating an analog signal-dependent result as a function of the digital pulses, the digital value representing the analog signal in a way that is different than a way in which the digital pulses represent the analog signal;
checking the analog signal-dependent result and a digital value generated by the A/D converter as a function of the analog signal for conformance with one another;
integrating the A/D converter to be monitored into a central processing unit having a plurality of analog signal connections for receiving analog signals to be digitized by the A/D converter;
generating the pulse sequence outside of the central processing unit using a signal-processing circuit;
using the signal-processing circuit to carry out repeated comparison cycles, a beginning and an end of each of the comparison cycles being determine by a control signal output by the central processing unit to the signal-processing circuit;
determining in each of the comparison cycles when a signal-processing circuit capacitor, which is charged to an analog voltage and is isolated from the analog voltage when the comparison cycle begins, is discharged to below a constant threshold voltage; and
discharging the capacitor with a constant current.

12. A method for monitoring an operability of an analog to digital (A/D) converter configured for digitizing analog signals, comprising the steps of:
generating a sequence of digital pulses outside of the A/D converter as a function of an analog signal to be digitized by the A/D converter, at least one of a width and a repetition frequency of the digital pulses being analog signal-dependent;

generating an analog signal-dependent result as a function of the digital pulses, the digital value representing the analog signal in a way that is different than a way in which the digital pulses represent the analog signal;

checking the analog signal-dependent result and a digital value generated by the A/D converter as a function of the analog signal for conformance with one another;

integrating the A/D converter to be monitored into a central processing unit having a plurality of analog signal connections for receiving analog signals to be digitized by the A/D converter;

generating the pulse sequence outside of the central processing unit using a signal-processing circuit; and changing, at predetermined instants, an output of the signal-processing circuit representing the pulse sequence, the output otherwise remaining unchanged within a specific comparison cycle.

* * * * *